(12) United States Patent
Hunter et al.

(10) Patent No.: US 11,239,626 B2
(45) Date of Patent: Feb. 1, 2022

(54) MULTI-PASS ETALON FILTER

(71) Applicant: LightMachinery Inc., Ontario (CA)

(72) Inventors: John H. Hunter, Ontario (CA); Hubert Jean-Ruel, Ontario (CA); Ian J. Miller, Ontario (CA)

(73) Assignee: LightMachinery Inc., Ontario (CA)

( * ) Notice: Subject to any disclaimer, the term of this patent is extended or adjusted under 35 U.S.C. 154(b) by 525 days.

(21) Appl. No.: 16/282,799

(22) Filed: Feb. 22, 2019

(65) Prior Publication Data

US 2019/0257990 A1    Aug. 22, 2019

Related U.S. Application Data

(60) Provisional application No. 62/634,152, filed on Feb. 22, 2018.

(51) Int. Cl.
*H01S 3/106* (2006.01)
*H01S 5/14* (2006.01)
*G02B 26/00* (2006.01)
G02B 5/28 (2006.01)
G02B 5/122 (2006.01)

(52) U.S. Cl.
CPC .......... *H01S 3/1062* (2013.01); *G02B 26/001* (2013.01); *H01S 5/141* (2013.01); *H01S 5/146* (2013.01); *G02B 5/122* (2013.01); *G02B 5/284* (2013.01)

(58) Field of Classification Search
CPC ........ G01J 3/14; G01J 3/12; G01J 3/18; G01J 3/26; G01J 3/28; G01J 3/0208; G01J 2009/0257; G01J 2003/2879; G02B 5/284; G02B 5/20; G02B 5/122; G02B 26/001; G02B 6/29359; G02B 6/29358; G09G 3/3466; G02L 9/00; H04N 13/33; G01D 5/35312; G01L 9/0079; G02F 1/213; G02F 1/216; G02F 3/024; H01S 3/08027; H01S 3/1062; H01S 3/08036; H01S 5/141; H01S 5/146

See application file for complete search history.

(56) References Cited

U.S. PATENT DOCUMENTS

| | | | |
|---|---|---|---|
| 4,553,816 A | 11/1985 | Durand et al. | 359/359 |
| 5,666,225 A | 9/1997 | Colbourne | 359/589 |

(Continued)

OTHER PUBLICATIONS

"Etalon filters for Brillouin microscopy of highly scattering tissues" Shao et al. Opt Express. Sep. 19, 2016; 24(19): 22232-22238. Published online Sep. 15, 2016. doi: 10.1364/OE.24.022232.

(Continued)

*Primary Examiner* — Darryl J Collins
*Assistant Examiner* — Tamara Y. Washington
(74) *Attorney, Agent, or Firm* — Teitelbaum & Bouevitch; Neil Teitelbaum

(57) ABSTRACT

The invention relates to a multi-pass etalon-based optical filter in which input light once reflected from the etalon is returned back to the etalon for a second reflection to enhance etalon contrast. The external mirror may be tilted relative to the etalon so that two planes of incidence are orthogonal. The multi-pass etalon-based optical filter may be used to clean scattered light from an excitation wavelength in Raman and Brillouin spectroscopy.

18 Claims, 11 Drawing Sheets

(56) References Cited

U.S. PATENT DOCUMENTS

| | | | | |
|---|---|---|---|---|
| 5,903,393 A * | 5/1999 | Kalibjian | ........... | G02B 6/29358 |
| | | | | 359/618 |
| 6,075,647 A | 6/2000 | Braun et al. | .................. | 359/578 |
| 6,359,693 B2 | 3/2002 | Smith et al. | .................. | 356/519 |
| 2016/0139390 A1* | 5/2016 | Bukshtab | ................. | A61B 3/13 |
| | | | | 351/206 |
| 2016/0149374 A1* | 5/2016 | Chann | ..................... | H01S 5/405 |
| | | | | 372/23 |

OTHER PUBLICATIONS

"Tandem Fabry-Perot Interferometer TFP-1—Operator Manual" JRS Scientific Instruments, Downloaded Apr. 27, 2019.

\* cited by examiner

MULTI-PASS ETALON FILTER

CROSS-REFERENCE TO RELATED APPLICATIONS

The present invention claims priority from U.S. Provisional Patent Application No. 62/634,152, which is entitled "Multi-Pass Etalon-based Optical Filter", filed Feb. 22, 2018, which is incorporated herein by reference.

TECHNICAL FIELD

The present invention generally relates to optical spectrometers and elements thereof, and more particularly to optical filters using Fabry-Perot etalons.

BACKGROUND

Fabry-Perot (FP) etalons are frequency selective devices that are used in a variety of applications to discriminate between different wavelengths of light. An FP etalon is formed by two parallel partially reflective mirrors which are typically closely spaced, and transmit light at a series of wavelengths defined by the separation between the two partial reflectors. FP etalons may be made for any wavelength range, including radio, microwave, infrared, etc. Light that doesn't interfere constructively at the output of the FP etalon because the mirror separation is not an even multiple of half-wavelength, is reflected by the FP etalon.

An FP etalon may be used in transmission as a narrow-band optical filter, or in reflection as a notch filter to remove a selected wavelength. For example, in LIDAR systems where a pulse of laser light, for example at 532 nm, is directed toward a distant scattering object, and light scattered back toward the LIDAR is detected, an etalon may be used in reflection to remove other wavelengths to improve the signal to noise ratio (SNR) for the laser return. In other applications, for example those involving Raman or Brillouin spectroscopy where a laser is used to probe a material and inelastically scattered light of the laser is of interest, an FP etalon may be used in reflection as a notch filter to suppress strong laser light that is being scattered. It may be desirable to tune an FP etalon to follow a wavelength change of the laser.

In these and other application, a high wavelength selectivity of an etalon may be desirable. The wavelength selectivity of an FP etalon is generally the greater, the more reflective are the etalon's mirrors. For a lossless FP etalon with mirrors of reflectivity R, the maximum spectral contrast in transmission between on-peak and off-peak wavelengths may be estimated as $(1+R)^2/(1-R)^2$. For a mirror reflectivity R of 85%, the maximum transmission contrast may be about 152. When more contrast is desired, etalons may be combined in series. Subsequent etalons are typically tilted relative to the first one to avoid setting up a secondary etalon between the two etalons. With two or more separate etalons, tuning all of them to track a single wavelength becomes more complicated.

SUMMARY

Accordingly, the present disclosure relates to an optical filter comprising: a first Fabry-Perot (FP) etalon disposed in an optical path of input light and configured to split the input light into transmitted light comprising a target wavelength and first reflected light where the target wavelength is suppressed; and, a reflector disposed to receive the first reflected light, and to reflect the first reflected light back toward the first FP etalon as returned light for a second reflection therefrom.

An aspect of the present disclosure relates to an optical filter comprising a first Fabry-Perot (FP) etalon disposed to receive input light at a first angle of incidence in a first plane of incidence and to reflect a portion thereof as a first reflected light; and an external reflector disposed to receive the first reflected light, and to return the first reflected light back toward the first FP etalon as returned light for a second reflection therefrom, wherein the external reflector is oriented so that the returned light is incident upon the first FP etalon at a second angle of incidence in a second plane of incidence, wherein the second angle of incidence is substantially equal to the first angle of incidence in magnitude.

An aspect of the present disclosure relates to an optical filter comprising a first Fabry-Perot (FP) etalon disposed to receive input light at a first angle of incidence in a first plane of incidence and to reflect a portion thereof as a first reflected light; and an external reflector disposed to receive the first reflected light, and to return the first reflected light back toward the first FP etalon as returned light for a second reflection from the first FP etalon, wherein the external reflector is oriented so that the returned light is incident upon the first FP etalon at a second angle of incidence in a second plane of incidence, wherein the second angle of incidence is substantially equal to the first angle of incidence in magnitude, and wherein the second plane of incidence is substantially perpendicular to the first plane of incidence.

An aspect of the present disclosure relates to an optical spectrometer comprising the optical filter formed by the FP etalon and the reflector.

An aspect of the present disclosure relates to an optical system for measuring inelastic scattering of light, the optical system comprising an input port configured to collect input light scattered from a test object when the test object is illuminated at a target wavelength, a first Fabry-Perot (FP) etalon disposed in an optical path of the input light and configured to split the input light into transmitted light comprising the target wavelength and first reflected light where the target wavelength is suppressed; a reflector disposed to receive the first reflected light, and to reflect the first reflected light back toward the first FP etalon as returned light for a second reflection therefrom, and an output port disposed to collect the returned light after the second reflection from the first FP etalon.

An aspect of the present disclosure relates to a method for filtering out a target wavelength from input light, the method comprising: directing the input light at a Fabry-Perot (FP) etalon at a first incidence angle, the FP etalon tuned to transmit the target wavelength, to obtain first reflected light with the target wavelength partially suppressed; and, returning at least a portion of the reflected light back toward the FP etalon as returned light, so that the returned light is incident upon the FP etalon at a second incidence angle for a second reflection from the FP etalon to obtain second reflected light where the target wavelength is further suppressed, wherein the second incidence angle is substantially equal to the first incidence angle in magnitude.

An aspect of the present disclosure relates to a method for filtering out a target wavelength from input light, the method comprising: directing the input light toward a Fabry-Perot (FP) etalon for impinging thereon at a first incidence angle in a first plane of incidence, the FP etalon tuned to transmit the target wavelength, to obtain first etalon-reflected light wherein the target wavelength is partially suppressed; and, returning at least a portion the etalon-reflected light back toward the FP etalon for impinging thereon at a second incidence angle in a second plane of incidence to obtain second etalon-reflected light where the target wavelength is further suppressed, wherein the second incidence angle is substantially equal to the first incidence angle in magnitude, and wherein the second plane of incidence is substantially perpendicular to the first plane of incidence.

BRIEF DESCRIPTION OF THE DRAWINGS

The invention will be described in greater detail with reference to the accompanying drawings which represent example embodiments thereof, which are not to scale, in which like elements are indicated with like reference numerals, and wherein.

DETAILED DESCRIPTION

Figure 1A:
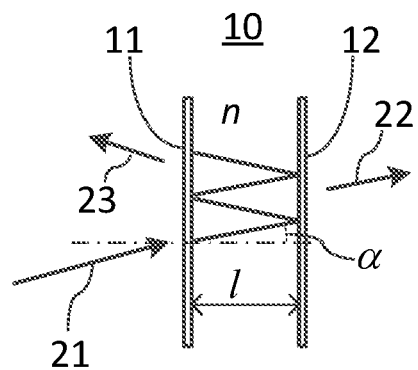
FIG. 1A is a schematic diagram of a Fabry-Perot (FP) etalon.

In the following description, for purposes of explanation and not limitation, specific details are set forth, such as particular circuits, sub-systems, optical and circuit components, mechanical elements, assemblies, or techniques, etc. in order to provide a thorough understanding of the present invention. It will be apparent to one skilled in the art that the present invention may be practiced in other embodiments that depart from these specific details. In other instances, detailed descriptions of well-known methods, devices, and tools are omitted so as not to obscure the description of the present invention.

Note that as used herein, the terms "first", "second" and so forth are not intended to imply sequential ordering, but rather are intended to distinguish one element or operation from another unless explicitly stated.

In embodiments described herein, an FP etalon may be coupled to one or more external reflectors in a multi-pass configuration to form a multi-pass optical filter (MPOF) that provides an enhanced suppression of one or more target wavelengths or one or more target spectral bands in input light. An external reflector may or may not be wavelength-selective. In example embodiments described below, the external reflector may be formed of one or more a spectrally non-selective surfaces or mirrors. However embodiments with wavelength-selective external mirrors may also be envisioned. The FP etalon, which may be referred below simply as etalon, may be tilted relative to the direction of propagation of input light, for example to facilitate the detection of reflected light at an output of the optical filter. The external reflector may be positioned to recycle light reflected from the etalon back into the etalon at a tilt of approximately the same magnitude as the tilt of the input light, but rotated into an orthogonal plane. For example, the initial input of light into the etalon may be tilted in the pitch axis, and the second input of light into the etalon after reflection from the external mirror may be tilted in the yaw axis, or vice versa. The first reflection of the input light from the etalon may be referred to as the first pass, while the second reflection of the input light from the etalon may be referred to as the second pass. The ratio of the transmitted light to the reflected light may be same or similar for both passes.

In some embodiments, a fraction of the input light after the two passes may be coupled into an optical fiber, for example a single-mode fiber. When the etalon is tilted relative to the input beam, at each reflection the cross-sectional area of the beam may be increased in size. The larger beam cross-section combined with beam divergence may reduce the efficiency of coupling the twice-reflected light into the single mode fiber. By setting the tilt of the second pass through the etalon at ninety degrees relative to the first pass, the coupling efficiency of the twice reflected light in the optical fiber may be enhanced.

In some embodiments, for example when an etalon-based multi-pass optical filter (MPOF) is used as a part of, or in combination with, an optical spectrometer, the etalon used in the MPOF may be wavelength-tunable. Examples of such etalons include, but are not limited to, gas-filled etalons with variable gas pressure, or piezo-electric actuator tuned spacing, and solid-state etalons in which the optical path length within the etalon may be tuned, for example by temperature.

Referring now to FIG. 1A, an FP etalon 10 may be formed with two parallel reflectors 11 and 12 spaced apart by some optically transparent medium of thickness 1 and refractive index n. The reflectors 11 and 12 may each have a same reflectivity R or may have different reflectivities, which may be for example in the range from about 0.5 to 0.95. The reflectors 11 and 12 may also be referred to herein as the etalon reflectors or etalon mirrors. They may be in the form of two partially reflecting mirrors or in the form of partially reflecting faces of a block of an optically transparent material or materials, which may include suitable reflecting coatings. Input light 21 entering the etalon splits into transmitted and reflected sub-beams at each interaction with the reflectors 11 and 12. Interference of all sub-beams that experience an even number of reflections, including zero, at the etalon's reflectors 11 and 12, produces transmitted light 22. Interference of all sub-beams that experience an odd number of reflections at the etalon's reflectors 11 and 12 produces reflected light 22.

Figure 1B:
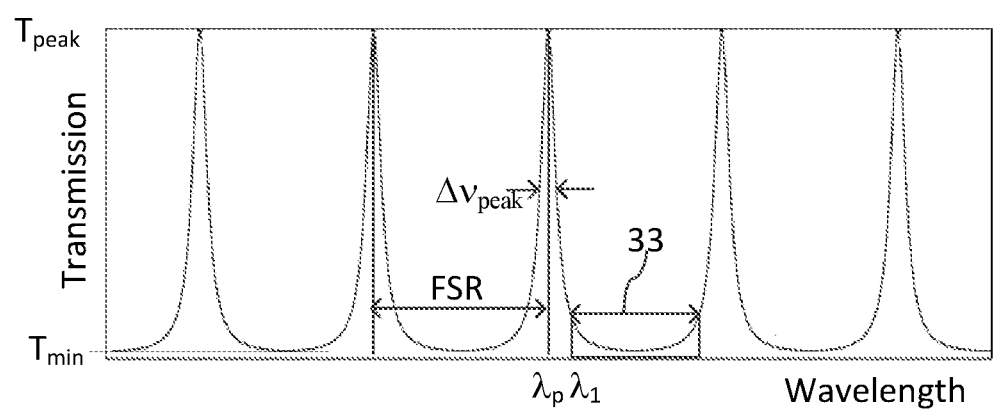
FIG. 1B is a graph illustrating an example transmission spectrum of a FP etalon.

Referring now also to FIG. 1B, a transmission spectrum T(λ) of an FP etalon includes a sequence of transmission peaks at wavelengths $\lambda_p = 2l \cdot n \cdot \cos(\alpha)/m$ that are separated by valleys; here m is an integer and α is a propagation angle of light between the etalon reflectors. The transmission peaks correspond to constructive interference of all transmitted sub-beams. The closer the etalon mirror reflectivities are to 1, the narrower are the peaks and the deeper are the valleys between them. An etalon may be characterized by its free spectral range (FSR), its finesse, and its contrast. The FSR is defined as a frequency distance $\Delta v_{FSR} = c/2 \ln \cos(\alpha)$ between adjacent transmission peaks. The finesse F of the etalon may be defined as the ratio of the FSR to a FWHM (full width at half-maximum) linewidth $\Delta v_{peak}$ of a transmission peak, $F = \Delta v_{FSR}/\Delta v_{peak}$. The closer the etalon mirror reflectivities are to 1, the smaller is the etalon linewidth $\Delta v_{peak}$ and the greater is its finesse F. The ratio of etalon's transmission at the peak ($T_{peak}$) and the minimum ($T_{min}$) of its transmission function may be referred to as the contrast. For an etalon with both mirrors of the same reflectivity R, the maximum transmission contrast may be estimated as $(1+R)^2/(1-R)^2$, where R denotes the reflectivity of the etalon mirrors, which may be nearly constant over a wavelength span of several FSR. By way of example, for a reflectivity R of 85%, the maximum transmission contrast of a lossless etalon may be about 152. The reflection spectrum R(λ) of a lossless etalon is complementary to its transmission spectrum, i.e. $R(\lambda) = (1 - T(\lambda))$. Here and in the following R(λ) denotes an apparent reflectivity of an etalon as a function of the wavelength λ of incident light, which includes a repeated pattern of minima spaced by the etalon FSR, and which depends on the angle of incidence. Hence, a high-contrast etalon operates as a periodic notch filter in reflection, filtering out etalon transmission wavelengths $\lambda_p$ from the reflected light 23. The contrast in reflection is approximately $4R/(1+R)^2/(1-T_{peak})$, where $T_{peak}$ is the peak transmission of the etalon at a peak transmission wavelength $\lambda_p$, and may be defined in a large part by the peak transmission of the etalon $T_{peak}$. In some embodiments a high peak transmission etalon, for example with $T_{peak} > 90\%$, or preferably $T_{peak} > 95\%$, and ideally $T_{peak} > 98\%$, may be selected to achieve good reflection contrast.

Figure 2:
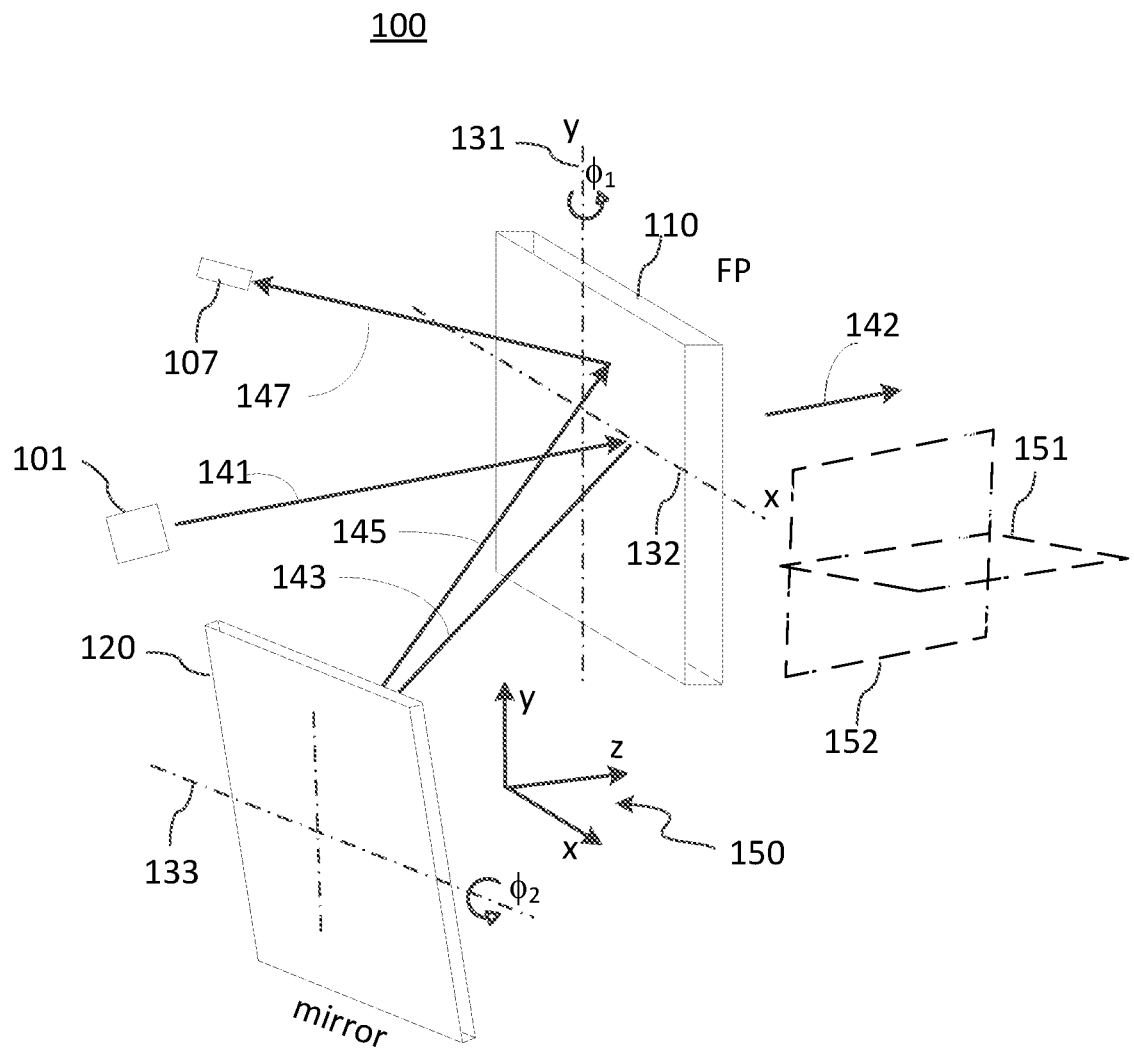
FIG. 2 is a schematic perspective view of a multi-pass optical filter (MPOF) formed with an FP etalon coupled to an external reflector in a double-reflection configuration.

An FP etalon may be used, for example, in inelastic scattering spectroscopy, in which a test subject is exposed to excitation light at a target wavelength $\lambda_t$, typically from a high-power laser, and a spectrum of scattered light is measured. Because inelastic scattering, such as Raman and especially Brillouin scattering, is typically a relatively weak process, separating the inelastically scattered signal from the excitation laser wavelength can greatly improve the quality of the scattering measurements. This separation may be achieved, for example, by directing the scattered light upon an FP etalon having a transmission peak tuned to the target wavelength $\lambda_t$, as illustrated in FIG. 2, and measuring the spectrum of light reflected from the FP etalon. A figure of merit for such measurements may be a ratio of the etalon reflection at a scattered wavelength of interest $\lambda_{scatter}$ to the reflection at the target wavelength $\lambda_t$, which may be referred to as a reflection contrast ratio $C(\lambda_{scatter}, \lambda_t) = R(\lambda_{scatter})/R(\lambda_t)$. The scattered wavelength $\lambda_{scatter}$ may be for example a wavelength $\lambda_l$ at a closest edge of a measured scattering spectrum. The reflection contrast ratio $C(\lambda_l, \lambda_t)$ is determined by a combination of the characteristics of the etalon and the wavelength separation $(\lambda_t - \lambda_l)$ between the excitation laser wavelength and the scattered signal spectrum relative to the linewidth $\Delta v_{peak}$ of the etalon. The range of wavelengths 33 indicates an example wavelength region with a sufficiently high figure of merit $C > C_{thr}$, where $C_{thr}$ is a threshold measurement contrast for a reliable measurement, as may be defined for a particular application. A higher reflectivity etalon means that high reflection contrast can be achieved for wavelengths that are closer to the excitation laser wavelength, but as the reflectivity of the etalon mirrors is increased, it may become more challenging to achieve high peak transmission.

A greater measurement contrast and stronger wavelength selectivity may be achieved by using two or more etalons in series. In some application tuning the wavelengths of peak transmission may be desired, which may be achieved by tilting an etalon to vary the angle of incidence, or by tuning the optical thickness of the etalon, i.e. the optical distance l·n between the etalon mirrors. Synchronously tuning two or more etalons when the target wavelength $\lambda_t$ is changed may require a more complex control. In a multi-pass configuration with angles of incidence of equal magnitude at each pass, tuning the optical thickness of an etalon may have an advantage of equal tuning rate at each interaction of the input beam with the etalon, whereas, if the angles of incidence are different, then the tuning rate will be different for the two passes. In general, angle tuning of the etalon may result in different tuning rates for both interactions if the interactions are not in the same plane.

Figure 3:
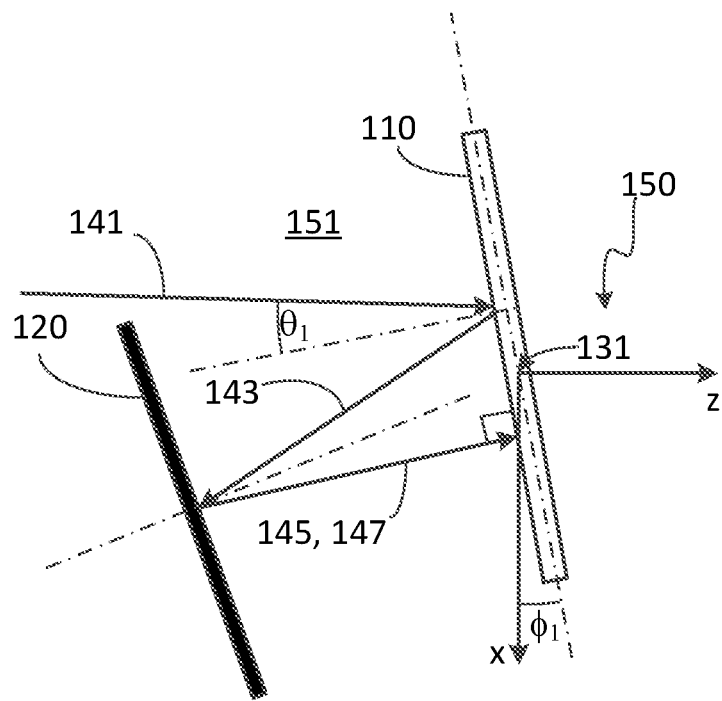
FIG. 3 is a schematic diagram illustrating a top view of the MPOF of FIG. 2.
Figure 4:
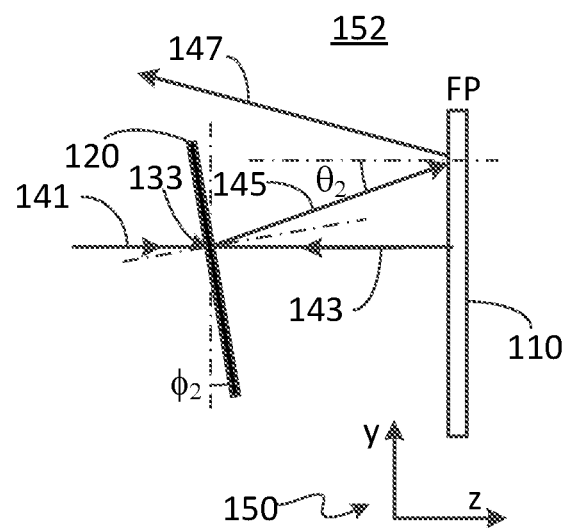
FIG. 4 is a schematic diagram illustrating a side view of the MPOF of FIG. 2.

FIGS. 2-4 schematically illustrate an etalon-based MPOF 100 according to an example embodiment. MPOF 100 includes an FP etalon 110 optically coupled in reflection to an external reflector 120 in the form of a mirror. In some embodiments MPOF 100 may further include an input port 101 which may operate as a source of an input light beam 141. In some embodiments MPOF 100 may include an output port 107 for receiving output light beam 147. In some embodiments the input port 101 may be in the form of, or include, collimating optics. In some embodiments the output port 107 may be in the form of, or include, an optical fiber. The operation of MPOF 100 may be described with reference to a Cartesian coordinate system (x,y,z) 150 in which the z-axis is parallel to the direction of propagation of the input light beam 141. FIG. 2 schematically illustrates MPOF 100 in a perspective 3D view. FIG. 3 illustrates the beam propagation in MPOF 100 in projection onto the (x,z) plane, and may be referred to as the top view, while FIG. 4 illustrates the beam propagation in MPOF 100 in projection onto the (y,z) plane, and may be referred to as the side view.

The FP etalon 110, hereinafter referred to simply as etalon 110, is disposed in an optical path of the input light beam 141, and is configured to split the input light beam 141 into a transmitted light beam 141 and a reflected light beam 143. The reflected light beam 143 may also be referred to herein as the first reflected light, or the first etalon-reflected light. Etalon 110 may be tilted with respect to the direction of incidence of the input light beam 141 so that the input light beam is incident upon etalon 110 at a first non-zero incidence angle $\theta_1$. For example, it may be rotated by a first tilt angle $\phi_1$ about an axis 131, which may be parallel to the y-axis of the coordinate system 150, and which may be referred to as the yaw-axis or as the first tilt axis. The first tilt angle $\phi_1$ may be selected to provide a desired first incidence angle $\theta_1$, and may be equal thereto. The input light beam 141 and the reflected light beam 143 define a first plane of incidence 151, to which they belong. In the illustrated example, the coordinate system 150 is selected so that the first plane of incidence 151 is parallel to the (x, z) plane of the coordinate system 150. By way of example, $\theta_1$ may be in the range from about 1 degree to about 3 degrees, and in some embodiment in a wider range from about 0.5 degree to about 7 degrees. Reducing the first incidence angle $\theta_1$ has an advantage of reducing the effect of input beam divergence on the transmission properties of the etalon and the MPOF.

Reflector 120 is disposed in an optical path of the reflected light beam 143, and is oriented so as to return the reflected light beam 143 back toward etalon 110 in the form of a returned light beam 145, so that the returned light beam 145 impinges upon the etalon 110 at a second non-zero angle of incidence $\theta_2$. The reflected light beam 143 and the returned light beam 145 define a second plane of incidence 152 upon the etalon. A portion of the return light beam 145 is reflected from etalon 110 in the form of a second reflected light beam 147, which may also be referred as the second etalon-reflected light beam. The second reflected light beam 147 may form an output light beam of MPOF 100, and may be collected by the output port 107.

In some embodiments the orientation of reflector 120 may be such that the second non-zero angle of incidence $\theta_2$ may be substantially equal in magnitude to the first angle of incidence $\theta_1$, i.e. $\theta_1 = \theta_2 = \theta$, for example within +\-10 arc minutes, i.e. $\theta_1 = (\theta_2 \pm 10')$, or within +\-10% of the magnitude of the first angle of incidence $\theta_1$, i.e. $\theta_1 = \theta_2 \cdot (1 \pm 0.1)$. In this case the transmission and reflection characteristics of etalon 110 in the first and second pass of the etalon coincide, so that the reflection contrast ratio of MPOF 100 is double that of etalon 110 without the external reflector 120, when measured in decibels (dB). In some embodiments, the orientation of reflector 120 relative to etalon 110 may be such that the first plane of incidence 151 is substantially orthogonal to the second plane of incidence 152, for example with the accuracy of orthogonality within +\-10 arc minutes, or +\-10% of the angle of incidence $\theta$. In some embodiments reflector 120 may be tilted by a second tilt angle $\phi_2$ about a second tilt axis 133 that is orthogonal to the first tilt axis 131, for example within +\-10 arc minutes, or +\-10% of the angle of incidence $\theta$.

Accordingly, in some embodiments mirror 120 may be oriented so as to reflect the first etalon-reflected beam 143, after the first pass of the etalon, back towards the etalon in the second plane of incidence 152 that is rotated by 90 degrees relative to the first, or input, plane of incidence 151. Because the two reflections from the etalon are relatively tilted, there is no secondary etalon interaction, and the reflected performance, e.g. the port-to-port transmission contrast, will be close to that of a single pass through the etalon squared. Because the same etalon is double passed, and at the same angle of incidence in both passes, tuning the optical thickness of the etalon may optimize performance for both passes simultaneously.

Figure 5:
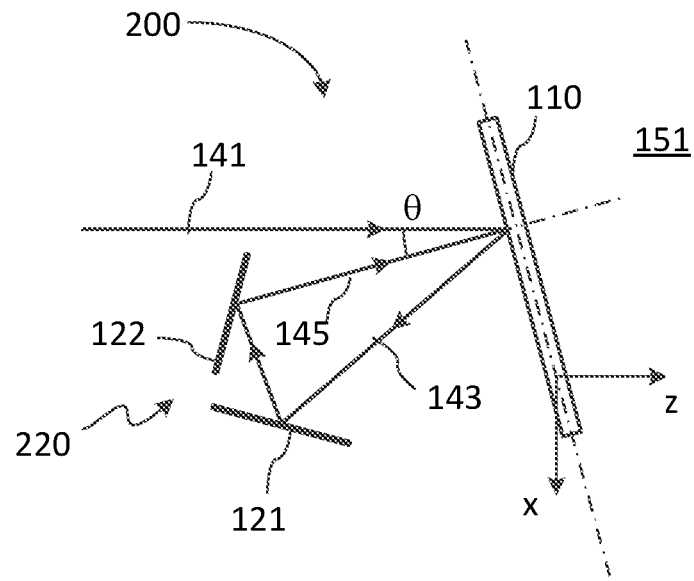
FIG. 5 is a schematic diagram illustrating a top view of an embodiment of MPOF with the external reflector having two oppositely-tilted reflective surfaces.
Figure 6:
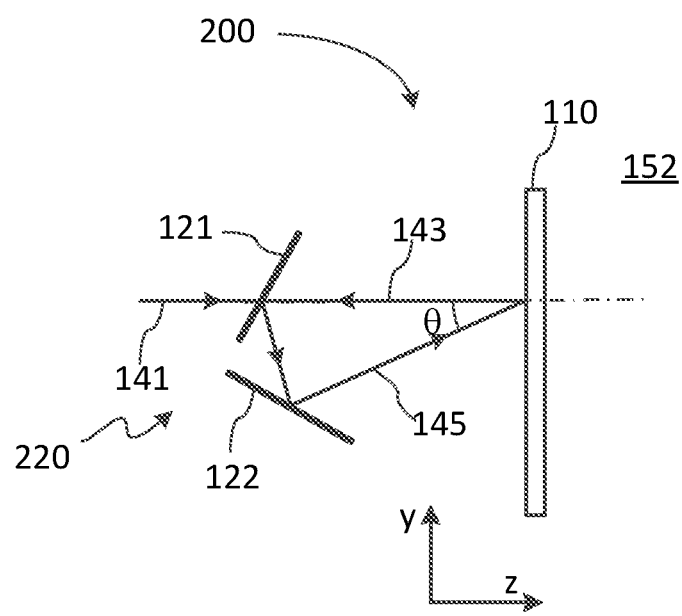
FIG. 6 is a schematic diagram illustrating a side view of the MPOF of FIG. 6.

FIGS. 5 and 6 illustrate an example etalon MPOF 200 according to an embodiment in which etalon 110 is coupled in reflection to an external reflector 220 that is formed of two reflective surfaces 121, 122 that are disposed at an angle to each other. The spatial location and orientation of the reflective surfaces 121, 122 may be chosen so that the return light 145 and the input light 141 at least partially overlap at the etalon 110, thereby eliminating possible effects of spatial non-uniformity of etalon 110 on the MPOF performance. The first and second reflective surfaces 121, 122 may have opposite tilts in a plane that is orthogonal to the plane of incidence of the input beam 141. The first reflective surface 121 may function as a turning mirror, and is oriented to steer the first etalon-reflected light beam 143 above or below the first plane of incidence (x,z) 151 defined by the input and first etalon-reflected light beams 141, 143. The second reflective surface 122 may be disposed between the input and reflected light beams 141, 143 to receive the reflected light beam 143 steered by the first reflective surface 121. The second reflective surface 122 may be tilted oppositely to the first reflective surface 121 to steer the light beam it receives back towards the first plane of incidence 151, so as to impinge upon the same location on the etalon 110 from which the input light beam 141 was first reflected, and at the same angle of incidence in magnitude $\theta$. The reflective surfaces 121, 122 may be embodied with two separate mirrors, two joint mirrors, or as different faces of a prism.

In some embodiments an etalon may be coupled to an external reflector in the form of a retro-reflector, such as for example a roof mirror with two perpendicular reflective mirrors, a roof prism with two perpendicular reflective faces, or a cube corner reflector with three faces at 90 degrees to each other. In such embodiments the angle of incidence $\theta$ upon the etalon in the first pass and the second pass may be preserved regardless of the etalon tilt, but with the two passes intersecting the etalon at different points. These embodiments may be less sensitive to the alignment of the external reflector, with the equality of the angles of incidence in the first and second passes automatically maintained, either in one plane with the roof mirror or roof prism, or in two orthogonal planes with the corner cube.

Figure 7:
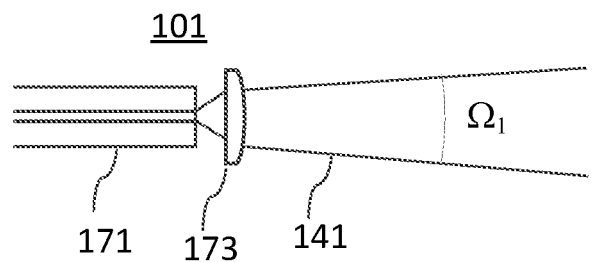
FIG. 7 is a schematic diagram of an input port of a MPOF according to an embodiment.

Referring to FIG. 7, in some embodiments the input light beam 141 may be delivered to the etalon using multi-mode or single mode optical fiber 171. The input port 101 may be in the form, or include, collimating optics 173, such as a collimating lens with a sufficiently long focal length, so that the divergence angle $\Omega_1$ of the input light beam 141 is sufficiently small and does not significantly degrade the performance of MPOF 100. Here, the divergence angle of a beam may be understood as a FWHM width of an angular distribution of the light intensity in the beam. The higher the finesse of the etalon 110, the more sensitive the wavelength selectivity of MPOF 100 may be to the divergence of the input light beam 141. There may be a minimum focal length of the input port 101 that will give good device performance, e.g. a desired suppression of the target wavelength, for a given etalon finesse F. In some embodiments, the collimating lens 173 may be configured to collimate light delivered from a single mode fiber, so as to provide the input light beam 141 that is well collimated, for example with the divergence angle $\Omega_1$ of less than 2 arc minute, or less than 1 arc minutes in some embodiments.

Figure 8:
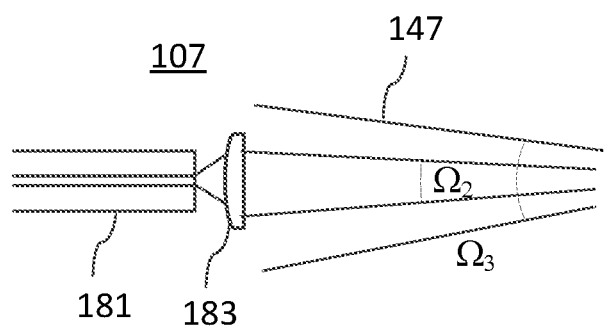
FIG. 8 is a schematic diagram of an output port of a MPOF according to an embodiment.

Referring to FIG. 8, a coupling optics or lens 183 may be used in the output port 107 to collect at least a fraction of the output light 149 into another single mode or multi-mode optical fiber 181. In some embodiments the coupling optics 183 may match the collimating optics 173 in terms of its focal length and/or its numerical aperture (NA). In some embodiments the coupling optics 183 may have a slightly longer focal length than that of the input collimating optics 173. In some embodiments the coupling optics 183, such as a suitable coupling lens, may be configured to couple at least a portion of the output light 147 into an end of a single-mode fiber 181. The single mode fiber 181 may have an acceptance angle $\Omega_2$ that is equal or smaller than a beam divergence angle $\Omega_3$ of the output beam 147. Here, the acceptance angle of an optical port may be understood as a FWHM width of an angular distribution of a coupling efficiency of light in the optical port. In some embodiments the beam divergence angle $\Omega_3$ of the output light 147 may be somewhat greater than the beam divergence angle of the input light 141, for example due to etalon imperfections. By rejecting angular components of the output beam 147 with a weaker suppression of a target wavelength $\lambda_t$ than for a central ray of the output beam 147, the suppression of the target wavelength in the portion of the output beam 147 that is coupled into the optical fiber 171 may be enhanced. In some embodiments, the acceptance angle of $\Omega_2$ of the output port 107 may be at least 10% smaller than the beam divergence angle $\Omega_3$ of the output optical beam 147. In some embodiments the angular selectivity of the output port 107, which accepts only a selected angular fraction of the output light beam, may increase the reflection mode suppression of a target wavelength $\lambda_t$ at the output or MPOF 100 by approximately additional 4-10 times. By way of example, in some embodiments the output port 107 may be configured to have a numerical aperture NA≤0.2, or in the range of 0.1 to 0.15. In some embodiments the numerical aperture of the output port 107 may be equal or smaller than the numerical aperture of the input port 101.

Embodiments of a MPOF may use a wavelength-tunable FP etalon, in which the peak-transmission wavelengths $\lambda p$ are adjustable by varying the optical path length l·n between the two etalon mirrors. Example of tuning methods include varying the separation between the etalon reflectors mechanically, varying the temperature of the etalon and thereby changing the separation by thermal expansion or the thermo-optic effect, tilting the etalon relative to the direction of travel of the light, or in the case of air spaced etalons, by changing the density of air (or other gas) in the space between the reflectors.

Figure 9:
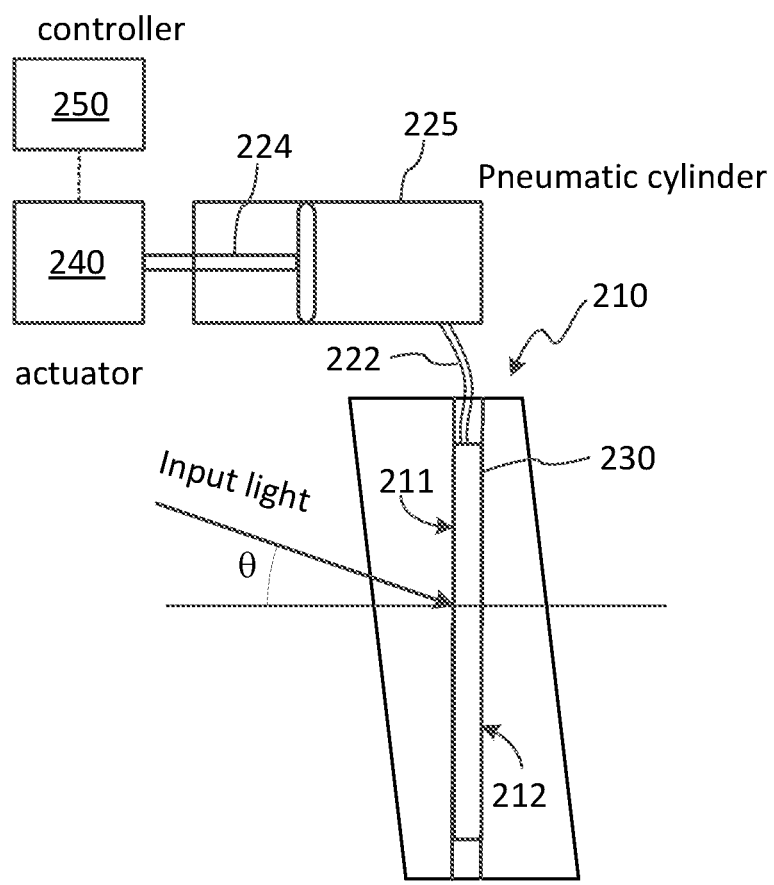
FIG. 9 is a schematic diagram of a wavelength-tunable gas-spaced etalon.

FIG. 9 schematically illustrates an example pressure-tunable etalon 210 in which etalon reflectors 211 and 212 are separated by a gas-filled chamber or channel 230, which may be referred to as the gas-filled cavity. The optical path length between etalon reflectors 211 and 212 is tuned by varying the pressure of a gas in the chamber or channel 230. A pneumatic cylinder 225 may be used to vary the gas pressure in the etalon. Any suitable gas can be used, including air. The chamber or channel 230 of the etalon may be connected to a variable-volume chamber of the pneumatic cylinder 225 with a tube 222. The pressure may be varied by an actuator 240 moving a control piston 224 of the pneumatic cylinder. A controller 250 in communication with the actuator 240 may be provided to control the pneumatic cylinder 225, and thereby to tune the peak-transmission wavelengths of etalon 210. Etalon 210 may be an embodiment of etalon 110 of FIGS. 2-6.

Figure 10:
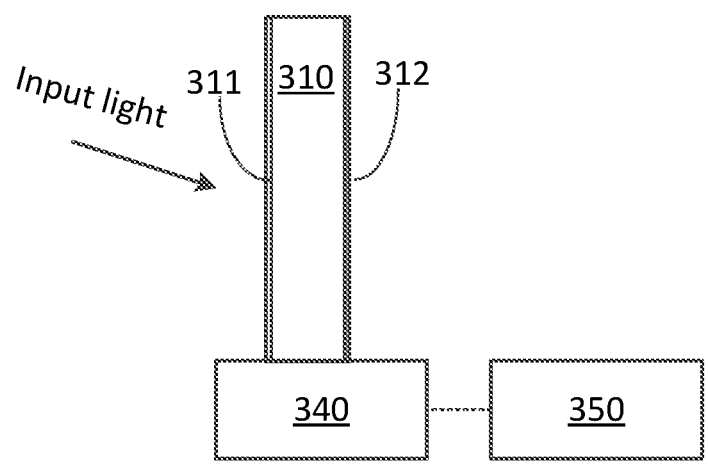
FIG. 10 is a schematic diagram of a wavelength-tunable solid-state etalon.

FIG. 10 schematically illustrates an example solid-state implementation of a tunable etalon, generally referred to as etalon 310. Etalon 310 may be formed by an optically transparent solid-state block with etalon reflectors 311, 312 formed by opposing parallel faces of the block, which may include suitable coatings. An actuator 340 in communication with a controller 250 may be used to vary the optical thickness of the etalon, for example by varying the refractive index n of the block's material. In some embodiments the actuator 340 may be a variable voltage actuator configured to apply an electric field to the etalon to vary the refractive index of the etalon by means of an electro optic effect, or to vary the distance between the reflectors 311 and 312 by means of a piezo electric effect. In other embodiments the actuator 340 may be in the form of a heater or a thermo-electric cooler (TEC) configured to vary the temperature of the etalon. Etalon 310 may be an embodiment of etalon 110 of FIGS. 2-6.

Figure 11:
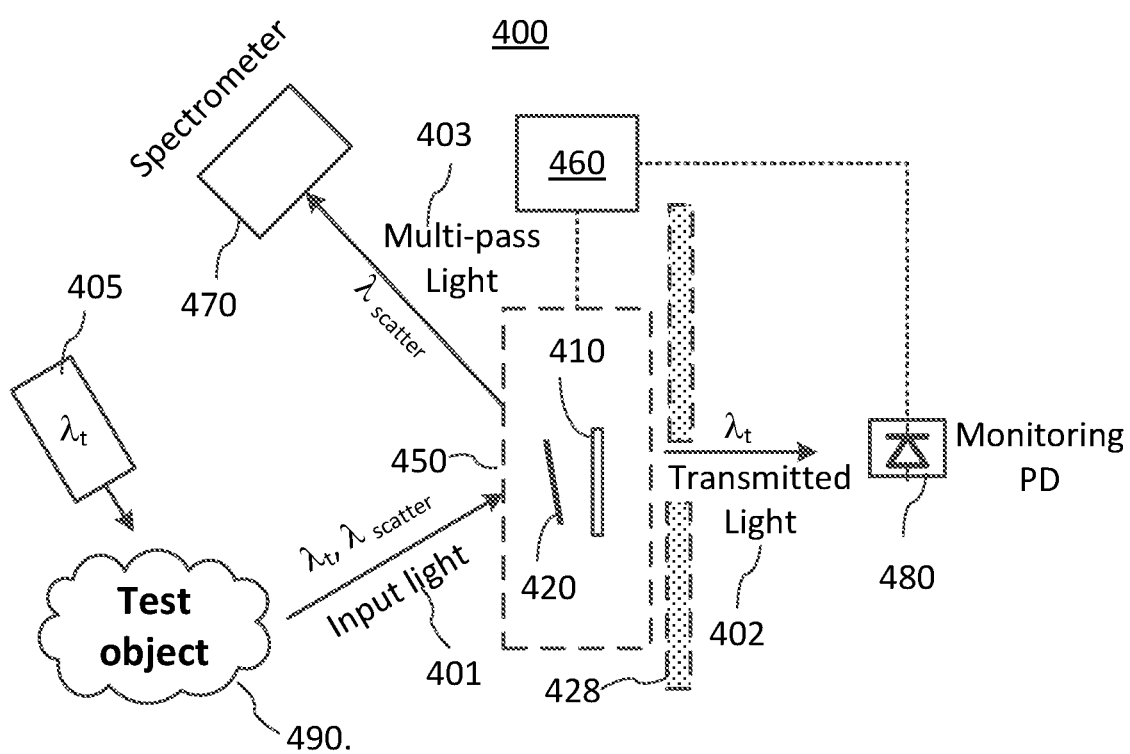
FIG. 11 is a schematic block diagram of an etalon-based MPOF operating in reflection as a notch filter of a spectrometer.

FIG. 11 schematically illustrates an example system 400 for measuring the spectrum of inelastically scattered light using MPOF 450 of the type described above with reference to FIGS. 2-6 and an optical spectrometer 470. A light source 405, for example a suitable laser, is configured to shine light of an excitation wavelength $\lambda_t$ upon a test medium 490, to be scattered by the test medium 490 through processes of elastic and inelastic scattering, such as for example Raman and/or Brillouin scattering. The excitation wavelength $\lambda_t$ may also be referred to as the target wavelength, and the wavelengths of inelastically scattered excitation light may be referred to as scattered wavelengths $\lambda_{scatter}$. MPOF 450 may be disposed to receive the light scattered by the test medium 490 as input light 401. MPOF 450 may be an embodiment of MPOF 100 or MPOF 200 described above, or a variation thereof, and may include an etalon 410 and an external reflector 420 coupled to the etalon in reflection, for example as described above with reference to FIGS. 2-6. The external reflector 420 is configured to return a portion of the input light once reflected from the etalon 410t back to the etalon for a second reflection therefrom, in some embodiments with a tilt. In some embodiments, MPOF 450 may include an input port, such as the input port 101 as described above with reference to FIGS. 2 and 7, which may be configured to collect light scattered from the test medium 490 when the test object is illuminated at the target wavelength, and to direct the collected light to etalon 410 as the input light 401. Etalon 410 may be tuned to a maximum transmission of the target wavelength, so that each consecutive reflection of the input light from the etalon selectively attenuates the target wavelength. In some embodiments etalon 410 may be wavelength-tunable, for example as described above with reference to FIG. 9 or FIG. 10. A portion of the input light 401 is output from MPOF 450 after a round-trip between the external mirror 420 and etalon 410, and a double-reflection from etalon 410, as output light 403. The output light 403, which may also be referred to as the double-reflected light or as the multi-pass light, is provided to a spectrometer 470, which is configured to measure and record its spectrum. In some embodiments, MPOF 450 may include an output port, such as the output port 107 as described above with reference to FIGS. 2 and 8, which is configured to collect the output light 403 for providing to the spectrometer 470. A portion of the input light 401 is transmitted through etalon 410 as transmitted light 402, and may be measured by an optional monitoring photodiode (PD) 480, which can be used to control a feedback loop to tune the etalon to maximize transmission of the target wavelength.

In some embodiment an optional light absorber 428 may be placed after the etalon to minimize scattered light. The light absorber 428 may implement a variety of methods, such as for example absorbing material, light labyrinths, etc., to prevent the light transmitted through the etalon from contaminating the reflected signal containing the scattered wavelengths $\lambda_{scatter}$ of interest.

Input light 401 may include excitation light at the excitation wavelength $\lambda_t$ and inelastically scattered light, for example due to Raman and/or Brillouin scattering, at a plurality of scatter wavelengths $\lambda_{scatter}$, which are shifted from the excitation wavelength $\lambda_t$. A tuning controller 460 may be provided to tune a peak-transmission wavelength $\lambda_p$ of etalon 410 to the excitation wavelength $\lambda_t$, $\lambda_p = \lambda_t$, so that the excitation wavelength $\lambda_t$ is primarily transmitted by MPOF 410 while the inelastically scattered wavelengths $\lambda_{scatter}$ are reflected to form the output light 403, in which the excitation wavelength $\lambda_t$ is suppressed or eliminated. The optional monitoring PD 480 may be used to provide a tuning feedback signal to the tuning controller 460. If the excitation laser wavelength changes, e.g. due to laser drift or use of a different laser, or to test in a different wavelength range, the feedback signal from the PD is changed; the controller 460 may then wavelength-tune the etalon 410 to maximize the electrical signal measured by the monitoring PD 480.

In embodiments where the excitation laser wavelength $\lambda_t$ is tuned to a peak transmission of the etalon, each reflection from the etalon increases a contrast between between a scattered wavelength $\lambda_{scatter} \cong \lambda_p +\backslash - FSR/2$ farthest away from a transmission peaks of the etalon and the target wavelength $\lambda_t$ by approximately a factor of $C=4R/(1+R)^2/(1-T_{peak})$, wherein $T_{peak}$ is the peak transmission of the etalon. Irregularities of the etalon may limit its peak transmission $T_{peak}$, and therefore also limit the measurement contrast between the scattered wavelength and the excitation wavelength. For example, if the etalon has a peak transmission of 95%, and a mirror reflectivity of 85%, the per pass contrast increase may be about 20 times (13 dB). Increasing the reflectivity may have little effect on per pass $\lambda_t/\lambda_{scatter}$ contrast increase for the scatter wavelength away from the transmission peaks, unless the peak transmission increases as well. Increasing the reflectivity of the etalon mirrors will reduce the FWHM linewidth of the etalon transmission and increase the contrast for the scattered wavelengths which are closer to the peak transmission wavelength. An optimum combination of the etalon FSR and the etalon finesse may also depend on the range of scattered wavelengths to be analyzed. Wavelengths scattered by about half of the etalon free spectral range (FSR) will experience the maximum contrast. The wavelength offset of the scattered wavelengths that may be reliably measured from the excitation laser wavelength $\lambda_t$ may depend on a maximum relative strength of the excitation wavelength in the measured signal that allows a reliable measurement of the scattered wavelength. In some embodiments, a minimum desired separation of a scattered wavelength to be measured from the excitation wavelength may be at least equal to the etalon transmission linewidth (FWHM) $\Delta v_{peak}$. In some embodiments, the minimum desired separation of a scattered wavelength to be measured from the excitation wavelength may be equal to half of the etalon transmission linewidth (FWHM) $\Delta v_{peak}$.

By way of example, an etalon FSR may be about 70 GHz (2.15 mm air space). For an etalon with a finesse of 15, the transmission linewidth $\Delta v_{peak}$ may be 4.7 GHz. Signals scattered from the excitation laser wavelength by less than 4.7 GHz will see more loss in the reflected light of the etalon. For example at 30 to 40 GHz shift from the transmission peak the increase in contrast per etalon reflection may be about 33 times (15 dB), while at 4.7 GHz shift from the transmission peak, the scattered signal would be reduced to about 85% of the incoming level for each pass of the etalon. Increasing the reflectivity of the etalon will decrease the etalon linewidth, which allows enhancement of wavelengths which are closer to the excitation laser (because of the reduced FWHM of the etalon). A high etalon finesse may make the alignment of various elements of the MPOF more sensitive, because the change in angle required to detune the transmission peak is smaller, and higher finesse increases the difficulty in achieving high peak transmission, because the flatness and parallelism requirements of the etalon mirrors also increase.

In some embodiments the linewidth $\Delta v_{peak}$ of the etalon may be chosen to provide minimum attenuation to the inelastically scattered wavelengths of interest. For a study of Raman scattering with relatively large wavelength shifts, a larger-FSR etalon will give better performance. By way of example, the Raman frequency shift may be about 500 GHz, and an etalon with FSR=1000 GHz may be used to measure the Raman scattering in corresponding materials. For a study of Brillouin scattering, with smaller scattering shifts, a smaller FSR, with proportionately narrower transmission bandwidth, may provide a better performance.

For larger-FSR etalons, for example when an FSR in excess of 200 GHz is desired, a solid etalon could be used instead of an air spaced version. A solid etalon will have higher temperature sensitivity than an air spaced etalon with the same FSR. For example for a target wavelength of 532 nm, and an etalon linewidth of 10 μm, the temperature of the etalon may need to be maintained within a range of ±1.5° C. to keep a peak transmission point of the etalon at the target wavelength.

In embodiments with an etalon equipped with a pressure tuning device, the etalon may be adjusted to maintain maximum transmission of the excitation laser wavelength by monitoring the residual reflected signal at the laser wavelength, and gradually adjusting the air pressure between the mirrors to minimize the intensity at the laser wavelength. Alternately, the intensity of the residual reflected target laser wavelength in the spectrometer system could be used to provide a control signal to optimize the transmission of the target wavelength through the etalon.

A MPOF in which an etalon is used in a multi-pass reflection mode provide advantages over a conventional transmission mode of etalon operation. Using an FP etalon operating in transmission as a tunable narrow-band filter is used for high resolution spectroscopy because it may provide a very good wavelength resolution and relatively high transmission efficiency by scanning its peak transmission over a wavelength range of interest. One advantages of a reflection-type MPOF as described above with reference to example embodiments is an ability to record a wide range of wavelengths simultaneously by separating them from a pump (target) wavelength. The output light of the MPOF may then be dispersed using one or more suitable dispersive element such as diffraction gratings, and a 1D or 2D detector array. Thus, a plurality of wavelengths can be analyzed simultaneously without the need to tune the etalon across the wavelength range of interest.

Figure 13:
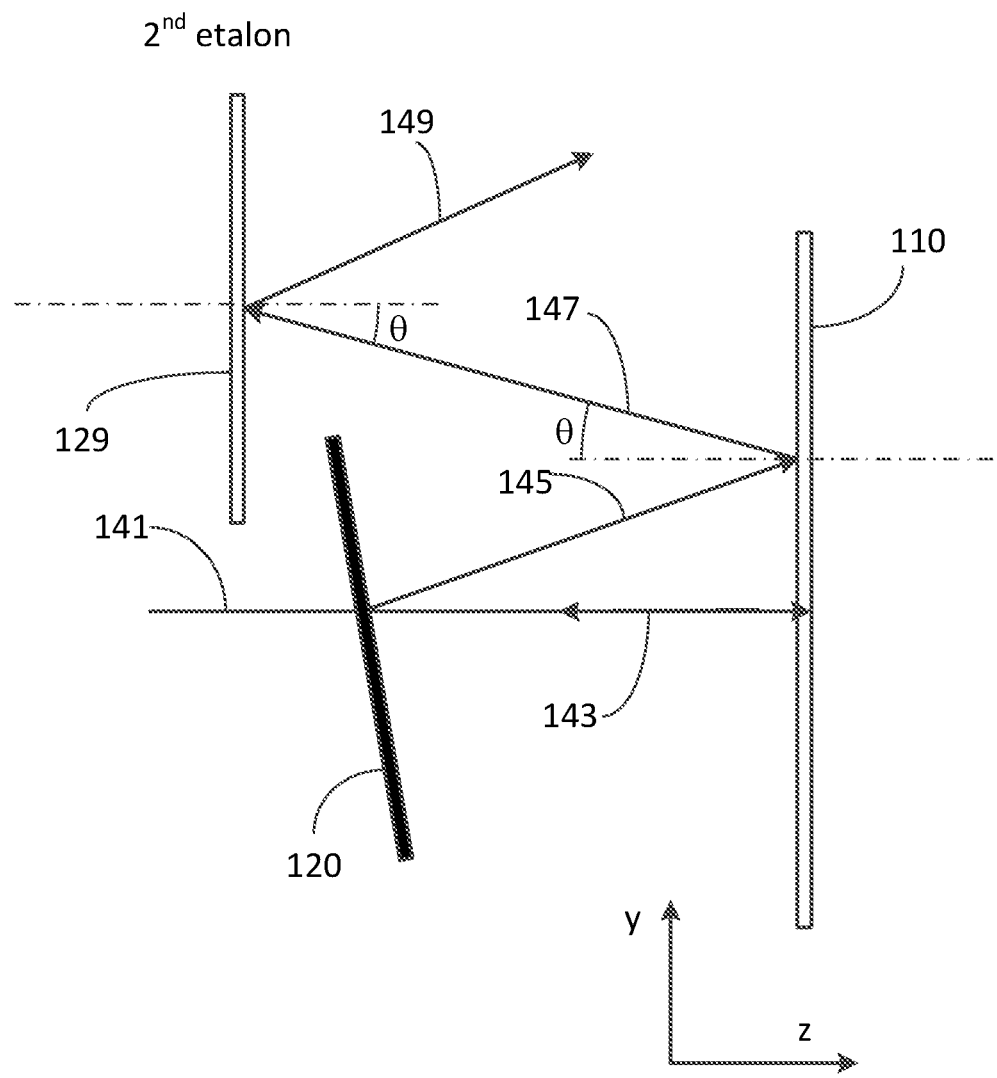
FIG. 13 is a schematic diagram of an MPOF with a second FP etalons disposed to reflect light after double-reflection from the first FP etalon.
Figure 14:
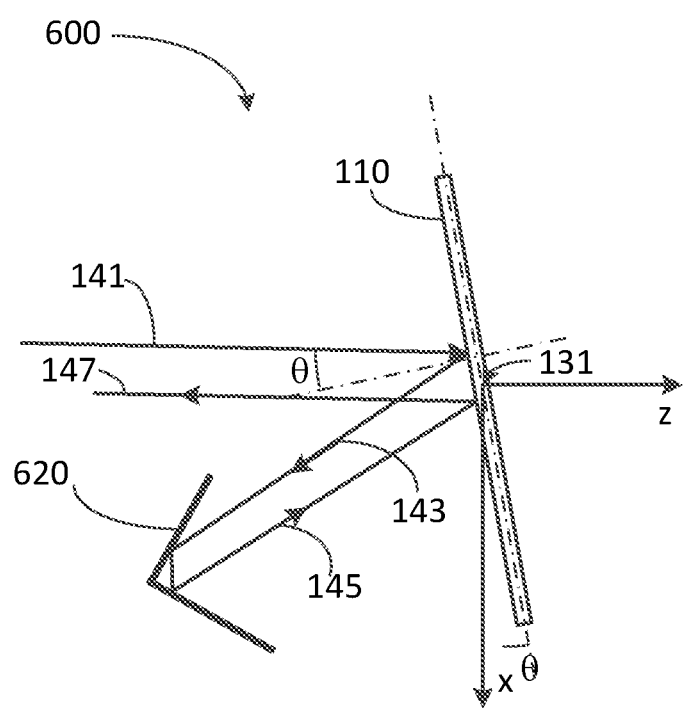
FIG. 14 is a schematic diagram of an MPOF with an external roof reflector.
Figure 15:
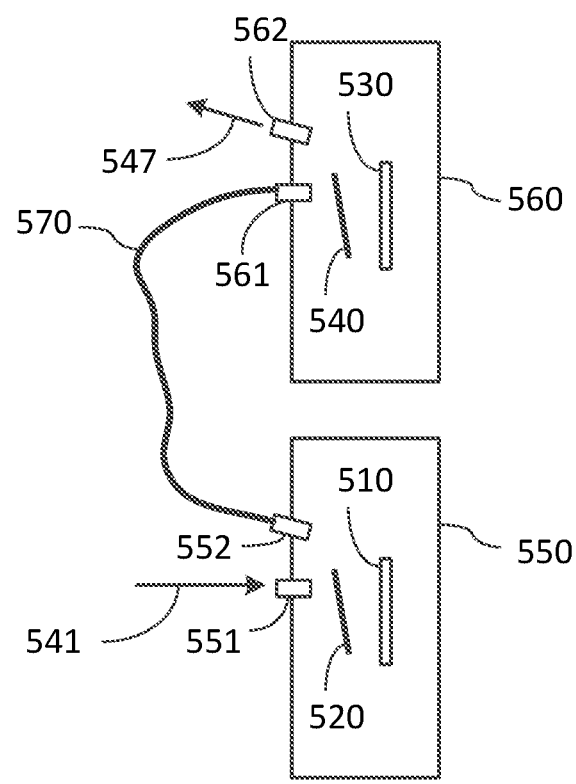
FIG. 15 is a schematic diagram of an optical filter comprising two MPOF optically coupled in sequence with an optical fiber.

Example embodiments described in the present disclosure may implement a method for filtering out a target wavelength from input light, comprising: directing the input light at an FP etalon (e.g. 110, 210, 310, 410 described above, and 510, 530 described below with reference to FIG. 15) at a first angle of incidence $\theta_1$ to obtain first etalon-reflected light wherein the target wavelength is partially suppressed; and, using an external reflector (e.g. 120, 220, 420 described above, and 160, 620 described below with reference to FIGS. 13 and 14)) at least a portion of the first etalon-reflected light back toward the FP etalon as retuned light, so that the returned light is incident upon the FP etalon at a second angle of incidence $\theta_2$ to obtain second etalon-reflected light where the target wavelength is further suppressed, wherein the second angle of incidence $\theta_2$ is substantially equal to the first angle of incidence $\theta_1$ in magnitude.

In some implementations, the method may include directing the input light at the FP etalon in a first plane of incidence (e.g. 151), and directing the retuned light at the FP etalon in a second plane of incidence (e.g. 152) that is substantially perpendicular to the first plane of incidence.

In some implementations, the method may comprise using the external reflector to tilt or deflect the returned light in a direction perpendicular to the first plane of incidence. In some implementations, the method may include tuning the FP etalon to vary the target wavelength.

In some implementations, the method may include performing a measurement on the second etalon-reflected light. In some implementations, the method may include passing excitation light at the target wavelength through a medium to obtain the input light, and performing the measurement may comprise measuring one of: an amount of inleastically scattered light or a spectrum of the inleastically scattered light.

Figure 12:
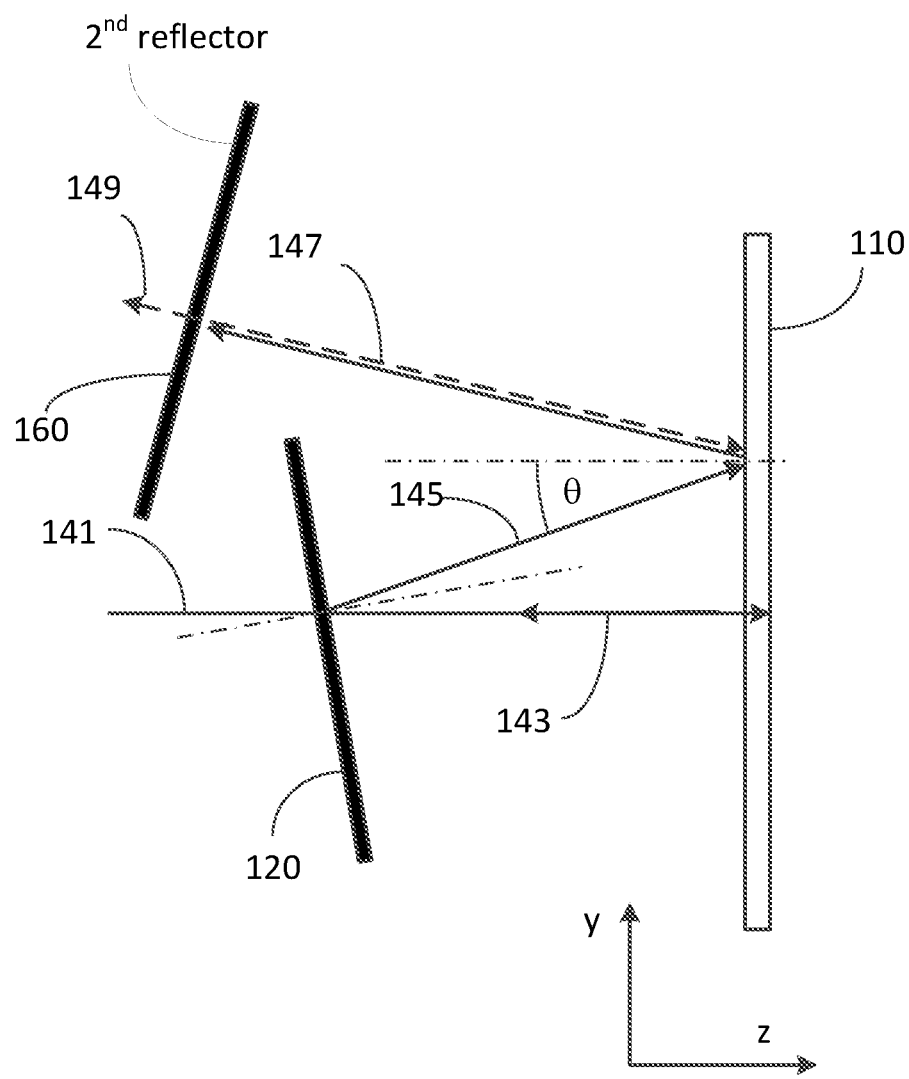
FIG. 12 is a schematic diagram of an embodiment of a triple-pass etalon-based MPOF.

The above-described exemplary embodiments are intended to be illustrative in all respects, rather than restrictive, of the present invention, and various modifications are possible. For example, in some embodiments the number of reflections from a same etalon may be increased by adding one or more additional mirrors. FIG. 12 illustrates an example modification of MPOF 100 of FIGS. 2-4, with a second external reflector 160 added so as to return the double-reflected light beam 147 back toward etalon 110 for a third reflection therefrom, preferably at the same angle of incidence θ, to obtain a triple-reflected light 149. Additional passes of the etalon have the advantage of increasing the rejection of the excitation laser wavelength relative to the scattered wavelength. In some embodiments, one or both of the reflectors 120, 160 may include a turning mirror as described above with reference to FIGS. 5 and 6. In some embodiments, one or more additional etalons may be provided to increase the wavelength selectivity of a MPOF and to provide a stronger suppression of a target wavelength. FIG. 13 illustrates an example modification of MPOF 100 with a second FP etalon 129 disposed in the path of the double-reflected light 147, with a reflection thereof from the second etalon 129 providing output light 149. In some embodiments, a cascade of three or more etalons sequentially coupled in reflection may be used.

In some embodiments, the external reflector that returns light reflected from an etalon back to the etalon for a second reflection may have two or more reflective surfaces that may be configured to preserve the angle of incidence upon the etalon regardless of the etalon tilt. These embodiments may allow an easier alignment of the reflector relative to the etalon as the equal angles of incidence at consecutive etalon reflections are automatically maintained. FIG. 14 schematically illustrates an example MPOF 600 with an external reflector 620 in the form of a roof mirror having two reflective surfaces mounted to each other at 90 degrees. The roof mirror 620 returns the reflected light 143 back toward etalon 110 along an optical path parallel to the optical path of the reflected light 143. In other embodiments the roof mirror 620 may be replaced with a corner cube reflector.

In some embodiments, two or more two or more MPOFs may be optically coupled in sequence to further enhance the suppression of a target wavelength. FIG. 15 illustrate an example embodiment in which an output port 552 of a first MPOF 550 is optically coupled to an input port of a second MPOF 560 with an optical fiber 570. In some embodiments the optical fiber 570 may be a single-mode optical fiber. In some embodiments the optical fiber 570 may be a single-mode optical fiber. Both etalons 550, 560 may be tuned to maximize transmission of a same target wavelength, i.e. to have at least one of their transmission peaks aligned in wavelength. In some embodiments both etalons 550, 560 may have the same FSR and transmission peak linewidth. In some embodiments etalons 550, 560 may have different FSR, and/or different transmission peak linewidth.

The first MPOF 550 may be as described above with reference to FIGS. 2-14, and may include an input port 551, an FP etalon 510 disposed to receive input light 541 from the input port 551, and an external reflector 520 coupled to the FP etalon in a reflective double-pass configuration as described above. The input port 551, which may include collimating optics, directs the input light 541 to reflect from etalon 510 toward reflector 520, which reflects it back toward etalon 510 for a second reflection therefrom. Output port 552 collects a portion of the input light 541 after a second reflection from the etalon, and couples it into the output port 552. The output port 552 may be an embodiment of the output port 107 described above, and may include coupling optics. The output port 552 may have a beam acceptance angle that is smaller than the beam divergence angle of the portion of the input light 541 it receives after the second reflection from etalon 510.

The second MPOF 560 may be as described above with reference to FIGS. 2-14, and may include an FP etalon 530 disposed to receive light from its input port 561, and a reflector 540 coupled to etalon 530 in a reflective double-pass configuration as described above. The input port 561 directs output light of MPOF 550, which is received from the optical fiber 570, to reflect from etalon 530 toward reflector 540, which reflects it back toward etalon 530 for a second reflection therefrom. The input port 561 may include collimating optics. Output port 562 collects a portion of input light of MPOF 560 after a second reflection from etalon 530, and couples it into the output port 562. The output port 562 may be an embodiment of the output port 107 described above, and may include coupling optics. The output port 562 may have a beam acceptance angle that is smaller than the beam divergence angle of the light beam it receives from etalon 530.

Thus the present invention is capable of many variations in detailed implementation that can be derived from the description contained herein by a person skilled in the art. For example, each of the example embodiments described hereinabove may utilize other optical elements; in other embodiments functions of two or more optical elements may be combined in a single component. Furthermore, although the example embodiments are described hereinabove with reference to a mirror or a combination of two or more mirrors as the external reflector, other embodiments may utilize other combinations of reflectors in its place, such as but not limited to a prism. Furthermore, elements or features that are described hereinabove with reference to a particular example embodiment may also relate to other described embodiments. All such and other variations and modifications are considered to be within the scope and spirit of the present invention as defined by the following claims.

We claim:

1. An optical filter comprising: a first Fabry-Perot (FP) etalon disposed in an optical path of input light and configured to split the input light into transmitted light comprising a target wavelength and first reflected light where the target wavelength is suppressed; and, a reflector disposed to receive the first reflected light, and to reflect the first reflected light back toward the first FP etalon as returned light for a second reflection therefrom, and an output port disposed to receive output light from the first FP etalon, wherein the output port is characterized by a numerical aperture that is smaller than 0.2 and wherein the output light is characterized by a beam divergence angle, and wherein the output port is configured to have an acceptance angle that is at least 10% smaller than the beam divergence angle.

2. The optical filter of claim 1 wherein:
the first FP etalon is disposed to receive the input light at a first angle of incidence in a first plane of incidence; and the reflector is oriented so that the returned light is incident upon the first FP etalon at a second angle of incidence in a second plane of incidence, wherein the second angle of incidence is substantially equal to the first angle of incidence in magnitude.

3. The optical filter of claim 2 wherein the reflector is tilted relative to the first FP etalon so that the first plane of incidence is substantially perpendicular to the second plane of incidence.

4. The optical filter of claim 2 wherein the reflector comprises a first reflective surface and a second reflective surface disposed at an angle to the first reflective surface, wherein the first reflective surface and the second reflective surface are configured so that the input light and the return light at least partially spatially overlap at the first FP etalon.

5. The optical filter of claim 1 wherein the first FP etalon is tilted by a first tilt angle about a first tilt axis that is orthogonal to a direction of incidence of the input light upon the first FP etalon, and wherein the reflector is tilted by a second tilt angle about a second tilt axis that is orthogonal to the first tilt axis.

6. The optical filter of claim 5 wherein the first tilt angle is substantially equal to the second tilt angle.

7. The optical filter of claim 1 wherein the reflector comprises a retroreflector.

8. The optical filter of claim 1 further comprising an output port disposed to receive output light from the first FP etalon, wherein the output light comprises the returned light that is reflected by the first FP etalon.

9. The optical filter of claim 1 wherein the first FP etalon comprises a gas-filled cavity, further comprising a pressure controller configured to vary a gas pressure in the gas-filled cavity to wavelength-tune the first FP etalon.

10. The optical filter of claim 1 wherein the first FP etalon comprises solid transparent material, further comprising a controller configured to vary a refractive index of the solid transparent material to wavelength-tune the first FP etalon.

11. The optical filter of claim 1 further comprising a second FP etalon disposed to reflect the retuned light after the second reflection thereof from the first FP etalon.

12. An optical system for measuring inelastic scattering, comprising the optical filter of claim 1 and an optical spectrometer disposed to receive output light of the optical filter, the output light comprising the returned light reflected from the first FP etalon.

13. A method for filtering out a target wavelength from input light, comprising:
directing the input light at a Fabry-Perot (FP) etalon at a first angle of incidence angle to obtain first etalon-reflected light wherein the target wavelength is partially suppressed; and, returning at least a portion of the first etalon-reflected light back toward the FP etalon as returned light, so that the returned light is incident upon the FP etalon at a second angle of incidence to obtain second etalon-reflected light where the target wavelength is further suppressed, wherein the second angle of incidence is substantially equal to the first angle of incidence angle in magnitude; an output port disposed to receive output light from the FP etalon, wherein the output port is characterized by a numerical aperture that is smaller than 0.2 and wherein the output light is characterized by a beam divergence angle, and wherein the output port is configured to have an acceptance angle that is at least 10% smaller than the beam divergence angle.

14. The method of claim 13 comprising performing a measurement on the second etalon-reflected light.

15. The method of claim 14 further comprising passing excitation light at the target wavelength through a medium to obtain the input light, wherein performing a measurement on the second etalon-reflected light comprises measuring one of:
an amount of inelastically scattered light in the second etalon-reflected light, or a
spectrum of the inelastically scattered light.

16. The method of claim 13 comprising directing the input light at the FP etalon in a first plane of incidence, and directing the returned light at the FP etalon in a second plane of incidence that is substantially perpendicular to the first plane of incidence.

17. The method of claim 16 wherein a reflector is used to deflect the first reflected light in a direction perpendicular to the first plane of incidence.

18. The method of claim 13 comprising tuning the FP etalon to vary the target wavelength.

* * * * *